United States Patent [19]

Jouen

[11] Patent Number: 5,477,185

[45] Date of Patent: Dec. 19, 1995

[54] IC AMPLIFIER WITH SATURATION DETECTION

[75] Inventor: Philippe B. E. Jouen, Caen, France

[73] Assignee: U.S. Philips Corporation, New York, N.Y.

[21] Appl. No.: 138,874

[22] Filed: Oct. 19, 1993

Related U.S. Application Data

[63] Continuation of Ser. No. 570,491, Aug. 21, 1990, abandoned.

[30] Foreign Application Priority Data

Sep. 1, 1989 [FR] France .................... 89 11491

[51] Int. Cl.$^6$ .................... H03K 17/04; H03G 3/30
[52] U.S. Cl. .................... 327/579; 327/375; 327/363
[58] Field of Search .................... 307/491, 300; 330/278, 2; 327/375, 579, 362, 363

[56] References Cited

U.S. PATENT DOCUMENTS

| | | | |
|---|---|---|---|
| 4,535,276 | 8/1985 | Yokobori | 318/254 |
| 4,608,524 | 8/1986 | Yokobori | 318/254 |
| 4,633,100 | 12/1986 | Tuijl | 327/575 |
| 4,853,645 | 8/1989 | Seevinck et al. | 330/255 |
| 4,857,861 | 8/1989 | Seevinck et al. | 330/255 |
| 4,945,314 | 7/1990 | Van Den Bungelaar | 330/2 |

FOREIGN PATENT DOCUMENTS 0328180  8/1989  European Pat. Off. .

OTHER PUBLICATIONS

Huijsing et al., "Low Voltage Operational Amplifier With Rail-to-Rail Input and Output Ranges," IEEE, 1985, pp. 1144-1150.

Horowitz et al., The Art Of Electronics, Cambridge University Press, 1980, p. 63.

*Primary Examiner*—Toan Tran
*Attorney, Agent, or Firm*—Bernard Franzblau

[57] ABSTRACT

An integrated circuit which includes a detection circuit for detecting the condition of saturation of an output transistor ($Q_0$) whose collector-emitter path is intended to pass an output current. A threshold circuit (A) of the detection circuit is arranged to perform a switching operation when a representative parameter of the condition of saturation crosses a given threshold. A control transistor (Q) is arranged to supply at least a part of the base current of the output transistor ($Q_0$) and the threshold circuit (A) performs its switching operation when the value of the current passing through the collector-emitter path of the control transistor exceeds a given level.

20 Claims, 3 Drawing Sheets

5,477,185

IC AMPLIFIER WITH SATURATION DETECTION

This is a continuation of application Ser. No. 07/570,491, filed Aug. 21, 1990, abandoned.

BACKGROUND OF THE INVENTION

It is an object of the present invention to provide an integrated circuit which comprises a detection arrangement for detecting the condition of saturation of at least one output transistor having a collector-emitter path through which an output current is passed. The arrangement includes a threshold circuit arranged to switch when a representative parameter of a saturation condition exceeds a given threshold.

The saturation of a transistor is manifested by a diminishing collector-emitter voltage $V_{ce}$ and it is a known technique to detect saturation by means of a threshold circuit which switches when the voltage $V_{ce}$ drops below a given threshold. Such a detection technique may thus be used to control an automatic gain control stage in order to reduce the gain of an amplifier which includes an output transistor subject to a saturation condition.

A field of application of a gain control system of this type which operates as a function of the condition of saturation of an output transistor in an amplifier, is a loudspeaker telephone set. In such a case the given threshold is to be selected in a manner such that in the worst case (small external load, high temperature), and when taking the manufacturing tolerances of the integrated circuit into account, the output transistor will never saturate. However, the result of such a choice is that one unduly restricts the maximum signal that can be obtained under normal operating conditions.

SUMMARY OF THE INVENTION

It is an object of the present invention to obtain an improved detection of the condition of saturation by detecting a specific phenomenon which characterises the passing of a transistor to the condition of saturation.

Applicants have in fact noticed that for transistors manufactured according to the usual manufacturing methods for integrated circuits, the phenomenon of saturation is accompanied by a considerable increase of the base current to be supplied because the parasitic transistors (pnp type for p-substrate technology) are rendered conductive. By way of example, a slight saturation may be sufficient to make the base current change from one hundredth to one tenth of the value of the collector current.

For this purpose, the integrated circuit according to the invention is characterised in that it comprises a control transistor arranged to produce at least a part of the base current of the output transistor and in that the threshold circuit is arranged to switch when the value of the current passing through the collector-emitter path of the control transistor exceeds a given level.

According to a first embodiment of the invention, the threshold circuit comprises a first diode connected in series between said collector-emitter path of the control transistor and a supply voltage source, a second diode connected in series between a first current source of given strength and the supply voltage source, while the junction of the first diode and said collector-emitter path of the control transistor is connected to a first input of a first differential amplifier and the junction of the second diode and the first current source is connected to a second input of the first differential amplifier.

In this manner one obtains at the output of the first differential amplifier a signal which induces a switching operation for a current level fixed by the choice of the strength (amplitude) of the first current source.

According to a second embodiment of the invention, the threshold circuit comprises a first serial branch, which includes a second diode and a first resistor and is connected in series between said collector-emitter path of the control transistor and the supply voltage source, and a first monitoring transistor whose base is connected to the junction between the first serial branch and the collector-emitter path of the control transistor. The collector-emitter path of the first monitoring transistor is connected to a first terminal of a second resistor whose second terminal is connected to the supply voltage source and is also connected to the base of the output transistor, in which circuit the base of the first monitoring transistor is connected to the base of a second monitoring transistor whose collector-emitter path is connected to a first terminal of a third d.c. diode whose second terminal is connected to the supply voltage source and which collector emitter path is also connected to a first terminal of a fourth diode whose second,terminal is connected to a second supply voltage source. The circuit includes a second current source having a given strength connected in series to a first terminal of a fifth d.c. diode whose second terminal is connected to the second supply voltage source, in which circuit the first terminal of the fourth diode is connected to a first input of a second differential amplifier and in which circuit the first terminal of the fifth diode is connected to a second input of the second differential amplifier.

In a third embodiment, a circuit according to the invention comprises a third monitoring transistor whose base is connected to that of the control transistor and whose collector-emitter path is connected to a first terminal of a sixth d.c. diode whose second terminal is connected to the first supply voltage source and which collector-emitter path is also connected to the base of the output transistor. The circuit includes a seventh diode whose first terminal is connected to a third current source having a given strength and whose second terminal is connected to the first supply voltage source, in which circuit the first terminal of the sixth diode is connected to a first input of a third differential amplifier and in which circuit the first terminal of the seventh diode is connected to a second input of the third differential amplifier.

The three embodiments described hereinbefore provide the advantage, because of the presence of the diodes, of being able to use one and the same differential amplifier for simultaneously monitoring opposite-phase output transistors.

The output of the threshold circuit, for example, formed by at least one of the differential amplifiers, can be connected in a manner known per se to the input of a switch circuit whose output is arranged to charge or discharge a storage capacitor as a function of the polarity of the output voltage of said threshold circuit. The capacitor has one terminal connected to a gain control input of a gain control circuit of an amplifier circuit which comprises said output transistor.

The integrated circuit may advantageously comprise:

a shunt regulator arranged to adjust the supply voltage of the amplifier circuit to a first reference value, the gain control circuit being arranged to influence (control) the gain of the amplifier circuit, at least as a function of the current passing through the shunt regulator;

a first means for varying, according to a first variation law, said voltage stored by the storage capacitor in a first direction corresponding to an increase of the gain when a current passes through the shunt regulator and for interrupting this action in the opposite case;

and a second means for varying, according to a second variation law faster than said first law, said stored voltage in a second direction opposite to the first direction when the supply voltage available at the supply terminals of the amplifier drops below a second reference value which is lower than the first reference value.

The second reference value may be close to the minimum supply voltage at which the amplifier operates properly.

The first means advantageously comprises a current comparator for comparing the current passing through the shunt regulator to a reference current.

According to a preferred embodiment the integrated circuit comprises a resistor having a first terminal connected to said terminal of the capacitor and a second terminal connected to said gain control input, and the output of the switch circuit is connected to said terminal of the capacitor.

The capacitor is thus when the supply voltage has a low level, discharged through a resistor which provides a time constant adapted to the relatively slow variations of the supply voltage and, when saturated, is discharged without a time constant.

BRIEF DESCRIPTION OF THE DRAWINGS

The present invention will be better understood by reading the following description, given by way of non-limiting example, with reference to the accompanying drawings, in which:

FIG. 3b shows an automatic gain control circuit associated with FIG. 3a;

DESCRIPTION OF THE PREFERRED EMBODIMENTS

Figure 1:
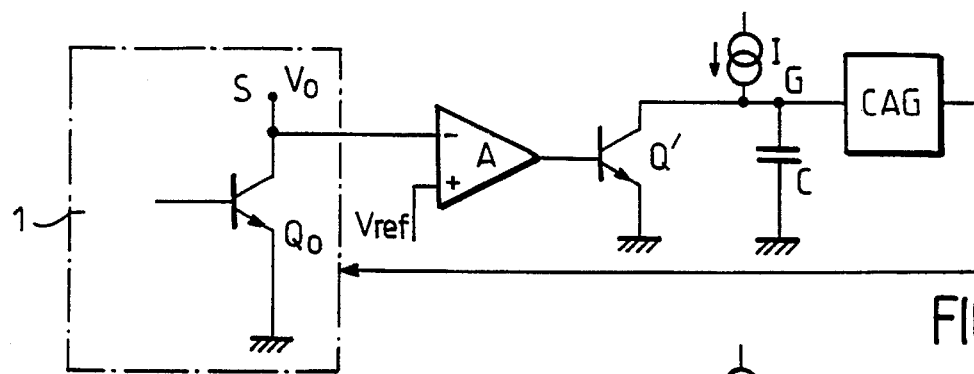
FIG. 1 shows a prior art detection arrangement in connection with an automatic gain control command.

As shown in FIG. 1, an amplifier 1 comprises an output transistor $Q_0$ of the npn type whose collector (point S) supplies an output voltage $V_0$, and whose emitter is connected to the common mode pole (ground). The voltage at point S is compared to a reference voltage $V_{ref}$. For this purpose, point S is connected to the inverting input of a differential amplifier A, whose non-inverting input is connected to the potential $V_{ref}$. When $V_0$ drops below $V_{ref}$, the output of amplifier A changes to HIGH. This output is connected to the base of a transistor Q' of the npn type whose emitter is connected to ground and whose collector is connected to a current source $I_G$ as well as to a first terminal of a storage capacitor C whose other terminal is connected to ground. When the output of amplifier A is HIGH, transistor Q' is conductive and capacitor C is discharged. The first terminal of capacitor C drives the gain control input of a gain control circuit of amplifier 1. The total or partial discharge of capacitor C causes the gain of amplifier 1 to drop, which in turn leads to the cut-off of transistor $Q_0$. The manner in which the gain of amplifier 1 is controlled is not critical and so it is indicated diagrammatically by the control line between the stage CAG and the amplifier 1.

An arrangement of this type is used, for example, in the TEA 1064 circuit manufactured by Philips, which in turn is used in loudspeaker telephone sets. It makes it possible to limit the voltage peak caused by the saturation of the output transistor(s). Such a peak limiting in effect tends to cause considerable distortion in the output signal, and this distortion increase rapidly as the level of the input signal increases.

In operation, at the signal peaks $V_0$ becomes slightly smaller than $V_{ref}$ and transistor Q' briefly discharges capacitor C which has a much higher current than I. In a state of balance, at high signal levels, transistor Q' is conductive during a fraction of time just sufficient to eliminate the charging caused by current I. If there are signals such as speech in which the levels change frequently, it is desired that a reduced gain be obtained with a very short time constant (for example, several milliseconds). On the other hand, if one wishes to avoid a pumping phenomenon, the capacitor is preferably recharged with a much longer time constant (100 to 200 ms, for example).

The choice of the value of $V_{ref}$ depends, however, on various parameters. In practice one has to provide that $V_{ref}$ has a sufficiently high level so that, reckoning with worst case operation (low charge impedance, high temperature) and variations in the manufacturing process, saturation will never be obtained. This leads to the choice of the value $V_{ref}$ which limits the maximum signal obtainable under normal conditions of use.

Figure 2:
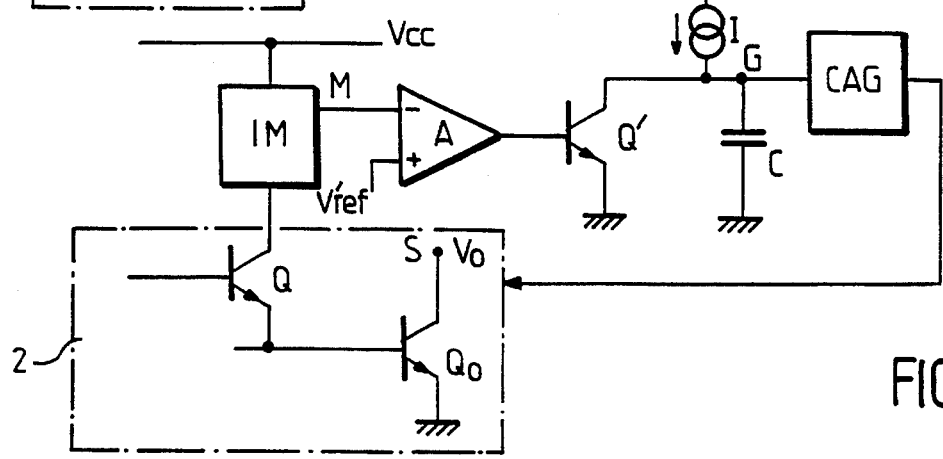
FIG. 2 shows a detection arrangement according to the invention in connection with an automatic gain control command.

FIG. 2 represents a detection arrangement according to the invention, according to which the start of the condition of saturation is immediately detected, which is to say that the selected threshold corresponds to the maximum acceptable saturation level, but no longer needs to take the variations of the manufacturing process into account. Thus, one ensures a small maximum distortion while making it possible for $V_0$ to reach the maximum signal value that can be compared with this distortion. To transistor $Q_0$ is connected a monitoring or control transistor Q which produces at least a part of the base current of transistor $Q_0$. Transistor Q is represented as the upstream transistor of a Darlington stage, the base of transistor Q being driven by the input signal and its collector presenting a circuit IM capable of producing at the output a measuring signal M which represents the current passing through the main current path (collector-emitter) of transistor $Q_0$. Thus, the only signal transistor Q is responsive to is the input signal at its base, i.e., irrespective of any bias voltages or the like. The automatic gain control loop is clearly identical with that of FIG. 1, signal M being applied to the inverting input of amplifier A, whose non-inverting input is coupled to a reference voltage $V'_{ref}$. When transistor $Q_0$ saturates, a parasitic transistor, whose existence results from the properties of the usual manufacturing methods of bipolar transistors, becomes conductive, which results in a very fast increase of the base current of transistor $Q_0$, and thus the collector-emitter current of monitoring transistor Q. An extremely sensitive threshold effect will be obtained because the value of the base current of transistor $Q_0$ may be multiplied by 10 (from, for example, one hundredth of the Collector current value to one tenth of this value).

Figure 3A:
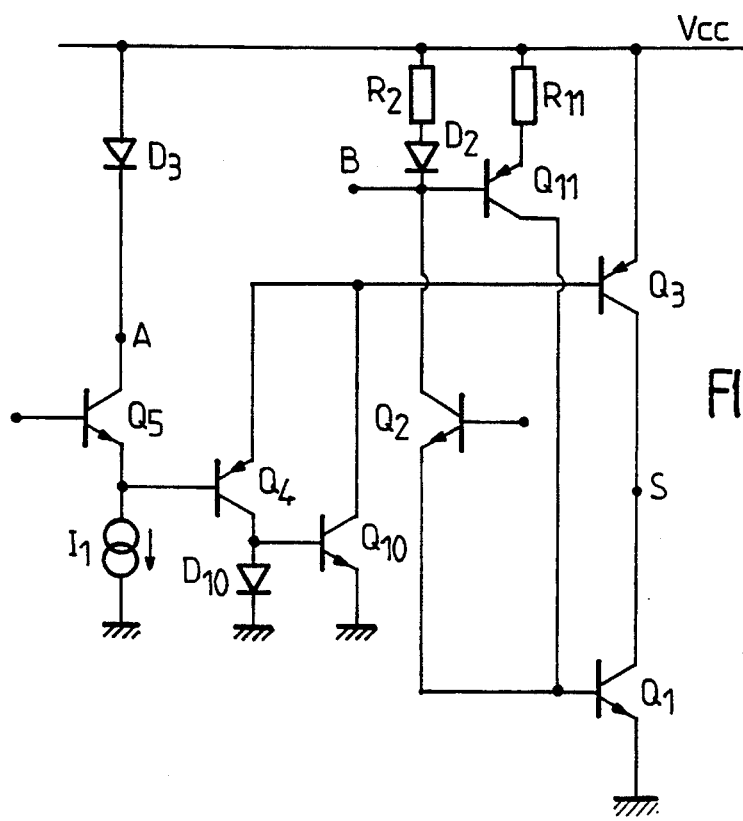
FIGS. 3a and 3b together show an embodiment of the invention comprising in FIG. 3a a saturation detection circuit for either one of the two push-pull connected output transistors.
Figure 3B:
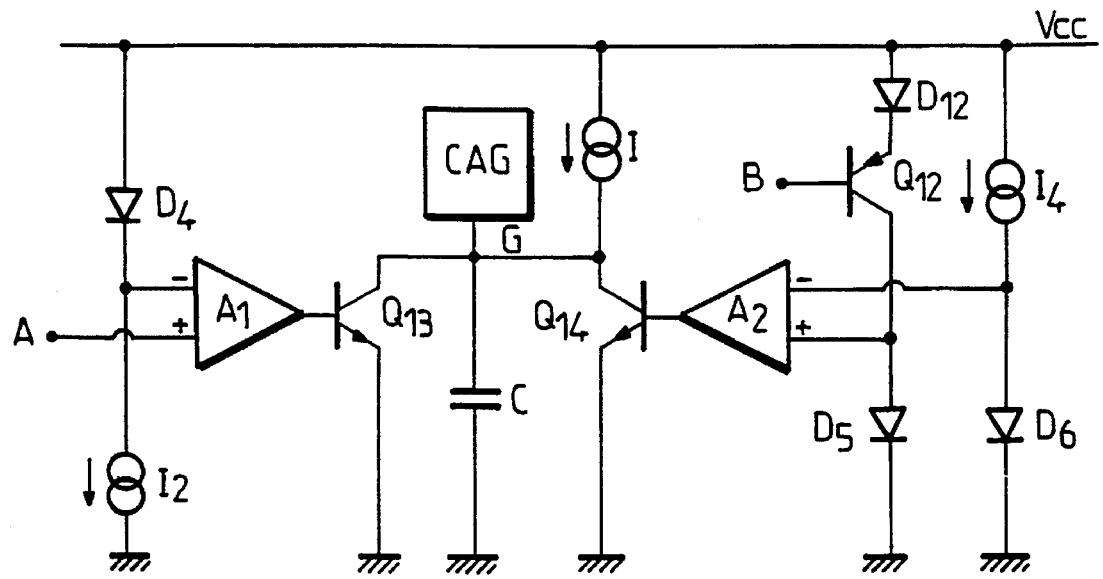

FIGS. 3a and 3b represent an embodiment of the invention corresponding to an amplifier described in the article by Johan H. HUIZING and Daniel LINEBARGER, published in IEEE Solid State Circuits, Vol. SC 20, Dec. 6, 1985, p. 1145 (FIG. 3). This amplifier comprises on the one hand Darlington output transistors ($Q_1$, $Q_2$ and also a Darlington amplifier $Q_5$, $Q_4$ and $Q_3$ on the other. The output transistors $Q_1$ and $Q_3$ are arranged to operate in push-pull.

FIG. 3a represents only the output stage of the amplifier, but the class AB polarization detection circuit is omitted.

The two output transistors are the transistors $Q_3$ (pnp) and $Q_1$ (npn) connected in push-pull between a supply voltage source $V_{cc}$ and the common mode pole (ground) or another supply voltage source. Output S of the amplifier is the junction of the collectors of the transistors $Q_3$ and $Q_1$. Transistor $Q_1$ forms a Darlington amplifier with transistor $Q_2$ (npn). Transistor $Q_3$ forms a Darlington amplifier with the cascaded transistors $Q_5$ (npn) and $Q_4$ (pnp). The emitter of transistor $Q_5$ is connected to the base of transistor $Q_4$ and to a current source $I_1$. The emitter of transistor $Q_4$ is connected to the base of transistor $Q_3$ and its collector is connected to the anode of a d.c. diode $D_{10}$. The cathode of the diode $D_{10}$ is connected to ground. The collector of transistor $Q_4$ is also connected to the base of a transistor $Q_{10}$ (npn) whose emitter is connected to ground and whose collector is connected to the base of transistor $Q_3$. The transistor $Q_{10}$ thus forms a current mirror circuit with diode $D_{10}$ and the emitter current of transistor $Q_{10}$ is equal to the current passing through diode $D_{10}$.

The diagram according to the invention differs from that of the above publication in that the collector of transistor $Q_5$ and/or transistor $Q_2$ is not directly connected to the supply voltage source $V_{cc}$.

In effect, the collector of transistor $Q_5$ (point A) is connected to the supply voltage source $V_{cc}$ via a d.c. diode $D_3$, and the collector of transistor $Q_2$ (point B) is connected to the supply voltage source $V_{cc}$ via a d.c. diode $D_2$ connected in series with a resistor $R_2$.

Point B is further connected to the base of a transistor $Q_{11}$ (pnp) whose emitter is connected to the supply voltage source $V_{cc}$ via a resistor $R_{11}$ and whose collector is connected to the base of transistor $Q_1$.

FIG. 3b represents a gain control arrangement to which may be connected the circuit of FIG. 3a in which the points A and B have a voltage of which the value is representative of a condition of saturation of the respective transistors $Q_3$ and $Q_1$. If transistor $Q_3$ saturates, its base current will increase and so will the emitter current of transistor $Q_4$, as will its base current. This will tend to eliminate the current in transistor $Q_5$, which happens when the base current of transistor $Q_4$ becomes equal to $I_1$, as a result of which the potential of point A will significantly increase because less current passes through diode $D_3$. If transistor $Q_1$ saturates, its base current will increase and so will the collector current of transistor $Q_2$, as will the current through the diode $D_2$ and the collector current of transistor $Q_{11}$ so that the voltage drops via resistors $R_2$ and $R_{11}$ will increase.

In FIG. 3b the non-inverting input of a differential amplifier $A_1$ is connected to point A and its inverting input is connected to the junction point of a serial branch comprising a diode $D_4$, whose anode is connected to the supply voltage source $V_{cc}$ and whose cathode is connected to a current source $I_2$. The output of amplifier $A_1$ is connected to the base of a transistor $Q_{13}$ (npn), whose collector is connected to the non-grounded terminal of the capacitor C and whose emitter is connected to ground. When transistor $Q_3$ saturates, the potential at point A will increase and when this potential exceeds the potential which is fixed by the current $I_2$, that is to say, when the current passing through transistor $Q_4$ falls short of current $I_2$, transistor $Q_{13}$ will become conductive and will discharge capacitor C in order to in known manner a reduction of the amplifier gain via control circuit CAG. The current $I_2$ is chosen to be equal to a fraction $I_1/n$ of the current $I_1$. The inverting input of a differential amplifier $A_2$ is connected to the junction point of a serial branch comprising a current source $I_4$, having a given strength, connected to the anode of a diode $D_6$, whose cathode is connected to ground. Point B is connected to the base of a transistor $Q_{12}$ (pnp) Whose emitter is connected to the supply voltage source $V_{cc}$ via a d.c. diode $D_{12}$ and whose collector is connected to ground via a d.c. diode $D_5$. The collector is also connected to the non-inverting input of amplifier $A_2$. When the transistor $Q_1$ saturates, the collector current of transistor $Q_2$ is increased and so is the current through diode $D_2$ and resistor $R_2$, as a result of which the voltage at point B is reduced. When the voltage drop in the resistor $R_2$ reaches the base-emitter voltage $V_{be}$ of a transistor (=a voltage $V_S$ of a diode is approximately 0.7 V), the transistor $Q_{12}$ will be rendered conductive. This current is compared to the current $I_4$ and transistor $Q_{14}$ is rendered conductive to discharge the capacitor C once the collector current of transistor $Q_{12}$ exceeds the current $I_4$.

Figure 4:
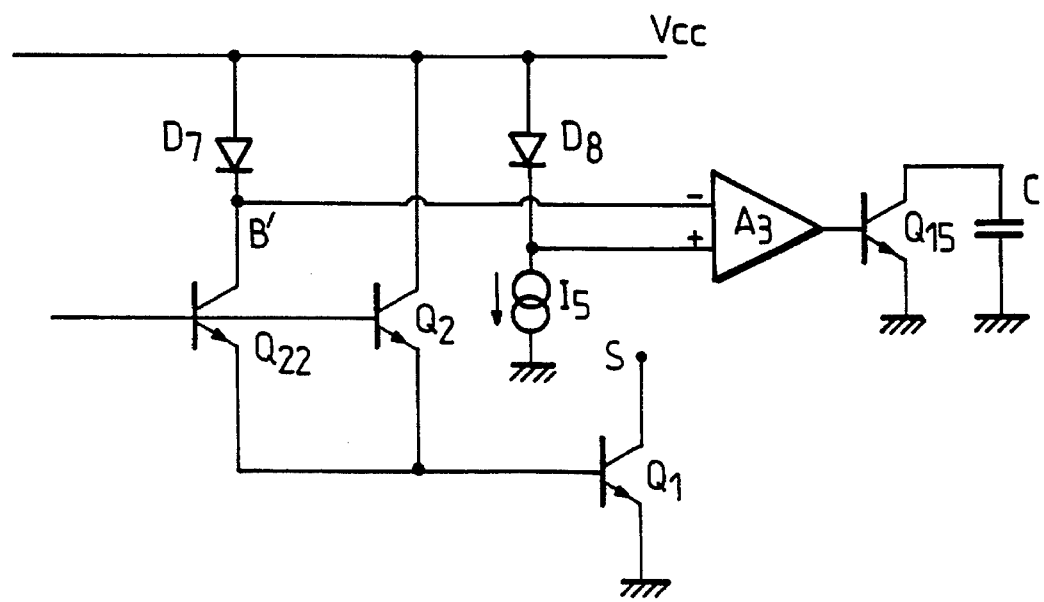
FIG. 4 shows another embodiment of the invention.

FIG. 4 represents the transistors $Q_1$ and $Q_2$. The collector of transistor $Q_2$ is now directly connected to the supply voltage source $V_{cc}$. A transistor $Q_{22}$, whose emitter is preferably dimensioned such that it is a fraction of that of transistor $Q_2$, whereby control transistor Q2 supplies a major part of the base current of output transistor 21. Transistor Q22 has its base and emitter connected to the base and emitter of the transistor $Q_2$ and its collector (point B') to the supply voltage source $V_{cc}$ via a d.c. diode $D_7$. The point B' is connected to the inverting input of a differential amplifier $A_3$ whose non-inverting input is connected to the junction of a serial branch comprising a d.c. diode $D_8$, whose anode is connected to the voltage source $V_{cc}$, and a current source $I_5$ of given amplitude. When the transistor $Q_1$ tends to saturate, the current passing through $Q_2$ tends to increase and so does the current passing through transistor $Q_{22}$. When the collector current of transistor $Q_{22}$ exceeds the current $I_5$, transistor $Q_{15}$ will be rendered conductive and will discharge the capacitor C, which induces in a known manner a gain reduction of the amplifier owing to the circuit CAG (not shown in FIG. 4).

The application to the automatic gain control circuit may be implemented in combination with other gain control elements, for example, those described in French Patent Specification No. 89 04407, filed Apr. 4, 1989, which corresponds to U.S. application Ser. No. 502,212 filed Apr. 4, 1990. The current source I may be switchable so as to induce the charging of capacitor C only when the supply voltage $V_{cc}$ has a first sufficiently high level. A circuit may also discharge the capacitor C through a resistor when the level of the supply voltage $V_{cc}$ is lower than a second level which itself is lower than the first level. When implementing the latter method it is possible to maintain the supply voltage at the minimum level, but distortions of the order of one millisecond may still occur. If one makes a correction of the distortion as described above, as a result the distortion is practically eliminated.

Figure 5:
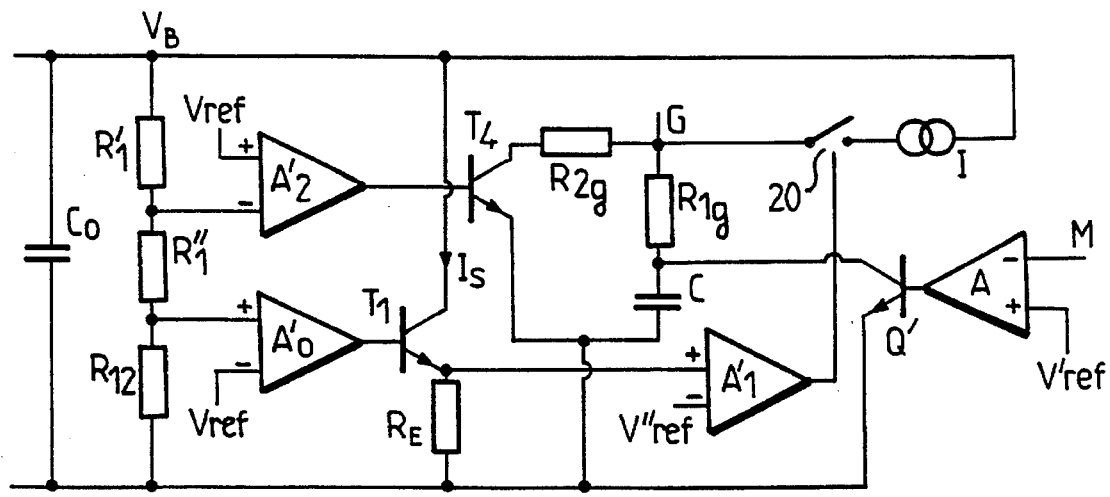
FIGS. 5 and 6 shows preferred embodiments of the invention.

According to FIG. 5 a gain control circuit comprises a series connection of three resistors $R'_1$, $R''_1$ and $R_{12}$ inserted between the voltage supply terminals and connected in parallel with a capacitor $C_o$. A non-inverting input of an amplifier $A'_o$ is connected to the junction of the resistors $R''_1$ and $R_{12}$ and an inverting input of an amplifier $A'_2$ connected to the junction of the resistors $R'_1$ and $R''_1$. The circuit also includes a transistor $T_1$ having an emitter resistor $R_E$ and with the emitter of $T_1$ connected to the non-inverting input of an amplifier $A'_1$. The output signal of amplifier $A'_1$ controls the connection between a current source I and the point G by means of a change-over switch 20. Amplifier $A'_o$ and transistor $T_1$ constitute a shunt regulator known per se. The emitter of transistor $T_1$ is connected to the non-inverting input of amplifier $A'_1$. Furthermore, the gain control voltage is stored and used in the following manner. A serial branch constituted by a resistor $R_{1g}$ and a storage capacitor C is connected between the common mode pole and the gain control input G of an amplifier. The switch 20, for example, a transistor operating as a switch, has for its object to bring the current source I into contact with the serial branch (point G) when the shunt regulator derives current (transistor $T_1$ not cut off), which makes it possible to charge in a delayed manner the capacitor C in order to obtain the maximum gain. To discharge the capacitor C (and provide a gain reduction by means of a voltage drop at point G), a threshold circuit is used which discriminates a second voltage threshold which is lower than the threshold of the shunt regulator. The non-inverting input of an amplifier $A'_2$ is connected to the potential $V_{ref}$ and the inverting input to the junction of resistors $R'_1$ and $R''_1$.

The output of the amplifier $A'_2$ is connected to the base of a transistor $T_4$ whose collector-emitter path is situated between the point G and the common mode pole. A resistor $R_{2g}$ may be inserted between the collector of transistor $T_4$ and point G and its value is chosen so as to ensure that the transistor $T_4$ has saturated when it is commanded to open.

The first threshold value $V_0$ which monitors the operation of the shunt regulator has the following value:

$$V_0 = \frac{R'_1 + R''_1 + R_{12}}{R_{12}} V_{ref}$$

The second threshold value $V_1$ which monitors the discharging of the storage capacitor C has the following value:

$$V_1 = \frac{R'_1 + R''_1 + R_{12}}{R''_1 + R_{12}} V_{ref} < V_0$$

One thus obtains the following operation. If $V_B > V_0$, transistor $T_1$ will derive a shunt current $I_s$. For $R_e I_s > V'_{REF}$ the output of amplifier $A'_1$ has its maximum level due to which switch 20 is closed. The current source I charges the capacitor C. When the capacitor C is fully charged, there is a maximum gain of amplifier 1. If $V_B$ is situated between $V_1$ and $V_0$, the shunt regulator will no longer derive current and switch 20 will be opened. Capacitor C will retain its stored value. Capacitor $C_o$ is capable of compensating for a brief instant. If the value of $V_B$ continues to drop and crosses the second threshold $V_1$, transistor $T_4$ will be opened (become conductive) and capacitor C will discharge via resistor $R_{1g}$ (and possibly $R_{2g}$). The voltage drop via $R_{1g}$ changes the voltage at point G and instantaneously changes the gain. The discharge time-constant is very short so that it is possible to lower the gain almost instantaneously. Transistor $T_4$ thus has to be able to pass such a current. The consumption (for example, that of a loudspeaker telephone set) is thus diminished so that $V_B$ stops decreasing without having to discharge C too much. The value of $R_{1g}$ (and possibly of $R_{2g}$) is preferably adjusted so that the voltage at the terminals of capacitor C again approaches the new value to be stored with a single low-amplitude excess, and consequently a relatively short time (practically about 10 ms). In contradistinction thereto, capacitor C, partly or completely discharged, cannot be recharged until $V_B$ has again reached the threshold $V_0$ and until the shunt regulator has derived a significant current $I_s$. Capacitor C is recharged progressively owing to the current source I and the gain starts increasing anew. This recharging is effected more slowly than the discharging and can be interrupted when the shunt current $I_s$ is too low the stability of the system is thus very good. Furthermore, capacitor C cannot be charged until a maximum current is available. The gain curve plotted against the voltage at point G has a rising characteristic.

Since capacitor C discharges rapidly, one may choose for $V_1$ a value close to the minimum supply value for which the operation of the amplifier 1 still produces little distortion. This is also advantageous in that the sudden drops of gain are then situated at very important peaks of the speech signals and are not audible. In effect, a sudden drop of gain generates considerable distortion but the human auditory system does not notice this type of distortion until the repetition rate thereof is high.

It is not necessary to use a high-value capacitor.

One may choose for capacitor C a value of 0.5 µF, and a current source of 1 µA. The presence, if any, of the resistor $R_{2g}$ makes it possible to limit, as required, the discharge current through transistor $T_4$ and avoid too sudden a discharge, if any, of the capacitor C which could lead to a minimum gain each time a distortion occurs. In effect, the capacitor $C_o$ takes a certain time to recharge, which causes voltage $V_B$ to take a certain time to again reach the thresholds $V_1$ and $V_0$.

By way of example one may take $R_{1g} = 3.6$ kΩ and $R_{2g} = 0$ Ω. In practice, the difference between $V_0$ and $V_1$ may be of the order of several hundred mV for a voltage $V_0$ of the order of 3.5 V.

To the junction of the resistor $R_{1g}$ and the capacitor C is also connected the collector of a transistor Q' (or those of transistors $Q_{13}$ and $Q_{14}$), that is to say, that one combines the actions with respect to gain control, that is, an instantaneous action with respect to the saturation phenomena and/or a delayed action with respect to the voltage value $V_B$.

Figure 6:
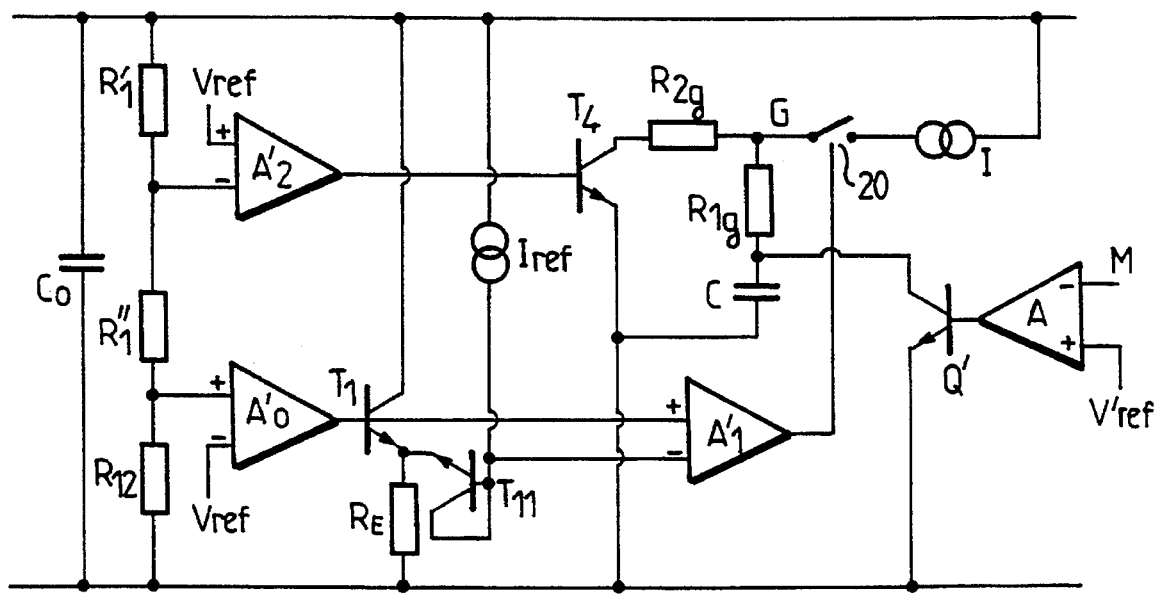

FIG. 6 corresponds to an embodiment according to which variations due to the manufacturing process are eliminated. Instead of comparing $R_E I_s$ and $V''_{ref}$, one compares $I_s$ to a reference current $I_{ref}$ (to the nearest multiplier coefficient). In order to realize this, a reference current source $I_{ref}$ is inserted between the supply voltage source and the inverting input of amplifier $A'_1$, and a transistor $T_{11}$ arranged as a diode (npn transistor whose collector and base are short-circuited) is inserted between the inverting input of amplifier $A'_1$ and the emitter of transistor $T_1$ of the, same type. The non-inverting input of amplifier $A'_1$ is connected to the base of transistor $T_1$.

Amplifier $A'_1$ thus operates as a comparator and measures $I_s < r I_{ref}$
where r is the ratio between the emitter surfaces of the transistors $T_1$ and $T_{11}$.

An additional advantage is that $R_E$ does not affect the measuring operation, and its value may be chosen for optimizing the stability of the voltage control loop $V_B$. Furthermore, it can relatively simply be achieved that r and $I_{ref}$ vary little with respect to each other with this method, whereas it is more difficult to determine $V'_{ref}$ and $R_E$ with respect to one another.

I claim:

1. An integrated circuit comprising: a detection arrangement for detecting a condition of saturation of an output transistor of an amplifier circuit which receives an input signal, said output transistor having a base current and a collector-emitter path intended to pass an output current, a threshold circuit arranged to switch when a current indicative of the condition of saturation exceeds a given threshold, a control transistor having a control electrode responsive only to said input signal and coupled to a base of the output transistor such that at least a part of the base current of the output transistor comprises at least a part of the collector current of the control transistor, means coupling the threshold circuit to the control transistor so that the threshold circuit switches when the collector current of the control transistor exceeds a given level, and wherein the threshold circuit comprises a first diode connected in series between said collector-emitter path of the control transistor and a supply voltage source, a second diode connected in series between a first current source and the supply voltage source, and means connecting a junction of the first diode and said collector-emitter path of the control transistor to a first input of a first differential amplifier and a junction of the second diode and the first current source to a second input of the first differential amplifier, wherein an output of the first differential amplifier forms an output of the threshold circuit.

2. An integrated circuit comprising: a detection arrangement for detecting a condition of saturation of an output transistor of an amplifier circuit which receives an input signal said output transistor having a base current and collector-emitter path intended to pass an output current, a threshold circuit arranged to switch when a current indicative of the condition of saturation exceeds a given threshold, a control transistor having a control electrode responsive only to said input signal and coupled to a base of the output transistor such that at least a part of the base current of the output transistor comprises at least a part of the collector current of the control transistor, means coupling the threshold circuit to the control transistor so that the threshold circuit switches when the collector current of the control transistor exceeds a given level, and wherein the threshold circuit comprises a first serial branch which includes a first diode and a first resistor connected in series between said collector-emitter path of the control transistor and a supply voltage source, a first monitoring transistor whose base is connected to a junction between the first serial branch and the collector-emitter path of the control transistor, means coupling a collector-emitter path of the first monitoring transistor to the supply voltage source via a second resistor and to the base of the output transistor, wherein the base of the first monitoring transistor is connected to a base of a second monitoring transistor whose collector-emitter path is connected to a first terminal of the supply voltage source via a second diode and which collector-emitter path is also connected to a second supply voltage source via a third diode, a current source connected in series with a fourth diode to the first and second supply voltage source, and means connecting a first terminal of the third diode to a first input Of a differential amplifier and a first terminal of the fourth diode to a second input of the differential amplifier, wherein an output of the differential amplifier forms an output of the threshold circuit.

3. An integrated circuit comprising: a detection arrangement for detecting a condition of saturation of an output transistor of an amplifier circuit which receives an input signal, said output transistor having a base current and a collector-emitter path intended to pass an output current, a threshold circuit arranged to switch when a current indicative of the condition of saturation exceeds a given threshold, a control transistor having a control electrode responsive only to said input signal and coupled to a base of the output transistor such that at least a part of the base current of the output transistor comprises at least a part of the collector current of the control transistor, means coupling the threshold circuit to the control transistor so that the threshold circuit switches when the collector current of the control transistor exceeds a given level, and which further comprises a monitoring transistor whose base is connected to a base of the control transistor and whose collector-emitter path is connected via a first diode to a first supply voltage source and which collector-emitter path is also connected to the base of the output transistor, a second diode connected to a current source and to the first supply voltage source, and means coupling a first terminal of the first diode to a first input of a differential amplifier and a first terminal of the second diode to a second input of the differential amplifier, wherein an output of the differential amplifier forms an output of the threshold circuit.

4. An integrated circuit which comprises: a detection arrangement for detecting a condition of saturation of an output transistor of an amplifier circuit which receives an input signal, said output transistor having a base current and a collector-emitter path intended to pass an output current, a threshold circuit arranged to switch when a current indicative of the condition of saturation exceeds a given threshold, a control transistor having a control electrode responsive only to said input signal and coupled to a base of the output transistor such that at least a part of the base current of the output transistor comprises at least a part of the collector current of the control transistor means coupling the threshold circuit to the control transistor so that the threshold circuit switches when the collector current of the control transistor exceeds a given level, wherein an output of the threshold circuit is connected to an input of a switch circuit having an output coupled to a storage capacitor for charging or discharging the storage capacitor to develop a gain control voltage as a function of an output voltage of said threshold circuit, said storage capacitor having one terminal connected to a gain control input of a gain control circuit of the amplifier circuit which includes said output transistor, a shunt regulator arranged to adjust the supply voltage of the amplifier circuit to a first reference value, the gain control circuit being coupled to the shunt regulator so as to control the gain of the amplifier circuit at least as a function of a current passing through the shunt regulator;

a first means for varying at a first rate the voltage stored by the storage capacitor in a first direction corresponding to an increase of the gain when a current passes through the shunt regulator;

and a second means for varying, at a second rate faster than said first rate, said stored voltage in a second direction opposite to the first direction when the amplifier circuit supply voltage drops below a second reference value which is lower than the first reference value.

5. An integrated circuit as claimed in claim 4, wherein the second reference value is close to the minimum value of the supply voltage at which the amplifier circuit operates properly.

6. An integrated circuit as claimed in claim 4, which further comprises a resistor connected between said one terminal of the storage capacitor and said gain control input, and wherein the output of the switch circuit is connected to said one terminal of the storage capacitor.

7. Circuit as claimed in claim 4, wherein the first varying means comprise a current comparator for comparing the current passing through the shunt regulator to a reference current.

8. An IC amplifier comprising:
an amplifier output stage including at least one output transistor subject to saturation by its output current,
means for detecting the start of saturation of the at least one output transistor by monitoring base current of said at least one output transistor and comprising a control transistor having a drive electrode directly connected to a control electrode of said one output transistor such that the control transistor collector current is a measure of the output transistor base current and wherein a control electrode of the control transistor is connected to receive an amplifier input signal, and
a threshold circuit coupled to the control transistor so that the threshold circuit will switch state when the collector current of the control transistor exceeds a given threshold level indicative of the start of saturation of said at least one output transistor.

9. An IC amplifier as claimed in claim 8 further comprising a gain control circuit controlled by an output signal of the threshold circuit and coupled to a gain control input of said amplifier so as to reduce the amplifier gain when said given threshold level is reached.

10. An IC amplifier as claimed in claim 8 wherein said control transistor and said output transistor comprise bipolar transistors of the same conductivity type and said control electrodes comprise the base electrodes of the bipolar transistors, and wherein the collector-emitter path of the control transistor and the base-emitter path of the output transistor form a DC series circuit connected to the terminals of a source of supply voltage for the amplifier.

11. An IC amplifier comprising:
an amplifier output stage including at least one output transistor subject to saturation by its output current at a given level of an amplifier input signal,
a control transistor having an output electrode coupled to a control electrode of the at least one output transistor and a control electrode for receiving the amplifier input signal whereby the control transistor supplies at least a part of an input current to the control electrode of the at least one output transistor,
a threshold circuit coupled to a main electrode of the control transistor so that the threshold circuit will switch state when a current passing through the control transistor exceeds a given threshold level indicative of the start of saturation of said at least one output transistor, and wherein said control transistor and said output transistor comprise bipolar transistors and said control electrodes comprise the base electrodes of the bipolar transistors, the output electrode and the main electrode of the control transistor comprise its emitter and collector, respectively, and said threshold circuit further comprises;
a first diode connected in a first series circuit with the collector-emitter path of the control transistor to terminals of a source of supply voltage for the amplifier,
a second diode connected in a second series circuit with a current source to said supply voltage terminals,
means connecting a junction between the first diode and the control transistor to a first input of a differential amplifier and a junction between the second diode and the current source to a second input of the differential amplifier, whereby the differential amplifier will switch state when the current in the first series circuit exceeds said given threshold level so as to indicate the start of saturation of said at least one output transistor, and
means coupling an output of the differential amplifier to an output terminal of the threshold circuit.

12. An IC amplifier comprising:
an amplifier output stage including at least one output transistor subject to saturation by its output current at a given level of an amplifier input signal,
a control transistor having an output electrode coupled to a control electrode of the at least one output transistor and a control electrode for receiving the amplifier input signal whereby the control transistor supplies at least a part of an input current to the control electrode of the at least one output transistor,
a threshold circuit coupled to a main electrode of the control transistor so that the threshold circuit will switch state when a current passing through the control transistor exceeds a given threshold level indicative of the start of saturation of said at least one output transistor, and wherein said control transistor and said output transistor comprise bipolar transistors and said control electrodes comprise the base electrodes of the bipolar transistors, wherein the output electrode and the main electrode of the control transistor comprise its emitter and collector, respectively, and said threshold circuit further comprises;
a first diode and a first resistor connected in a first series circuit with the collector-emitter path of the control transistor between one terminal of a supply voltage source for the amplifier and the base of the output transistor,
means coupling a second series circuit including a first monitoring transistor and a second resistor in parallel with the first series circuit and with a base of the monitoring transistor connected to a junction point in the first series circuit,
means coupling a third series circuit including a second monitoring transistor and a second diode to the terminals of the supply voltage source and with a base of the second monitoring transistor connected to the base of the first monitoring transistor,
means coupling a fourth series circuit including a current source and a third diode to said terminals of the supply voltage source, and
means coupling a first terminal of the second diode and a first terminal of the third diode to first and second inputs, respectively, of a differential amplifier having an output that forms an output of the threshold circuit.

13. An IC amplifier comprising:
an amplifier output stage including at least one output transistor subject to saturation by its output current at a given level of an amplifier input signal,
a control transistor having an output electrode coupled to a control electrode of the at least one output transistor and a control electrode for receiving the amplifier input signal whereby the control transistor supplies at least a part of an input current to the control electrode of the at least one output transistor,
a threshold circuit coupled to a main electrode of the control transistor so that the threshold circuit will switch state when a current passing through the control transistor exceeds a given threshold level indicative of the start of saturation of said at least one output transistor, and further comprising:

a first diode and a monitoring transistor connected in a first series circuit between one terminal of a source of supply voltage for the amplifier and the control electrode of the output transistor and with a control electrode of the monitoring transistor coupled to the control electrode of the control transistor, a second series circuit including a second diode and a current source coupled to terminals of the supply voltage source, and means coupling a first terminal of the first diode and a first terminal of the second diode to first and second inputs, respectively, of a differential amplifier having an output that forms an output of the threshold circuit.

14. An IC amplifier as claimed in claim 8 comprising:

means coupling an output voltage at an output of the threshold circuit to a control input of a switching circuit, means coupling an output of the switching circuit to a storage capacitor thereby to charge or discharge the storage capacitor to develop across the storage capacitor a gain control voltage as a function of the output voltage of the threshold circuit, and means coupling one terminal of the storage capacitor to a gain control input of a gain control circuit of the amplifier.

15. An IC amplifier as claimed in claim 14 further comprising means for controlling the charge and discharge of the storage capacitor as a function of the level of a source of supply voltage for the amplifier, said controlling means comprising a first controlled switching device for coupling and uncoupling a current source to the storage capacitor as a function of the supply voltage level and a second controlled switching device coupled to the storage capacitor to discharge the storage capacitor as a function of the supply voltage level.

16. An IC amplifier as claimed in claim 15 wherein said first switching device is closed to couple the current source to the storage capacitor when $V_B > V_0$, where $V_B$ is the level of the supply voltage and $V_0$ is a first voltage threshold level at which the amplifier operates without saturation of the output transistor, said second switching device being open when $V_B > V_0$, and said first and second switching devices both being open when $V_0 > V_B > V_1$, where $V_1$ is a second threshold level at which the output transistor of the amplifier will be driven into saturation, and wherein said first switching device is open and the second switching device is closed to rapidly discharge the storage capacitor when $V_1 > V_B$ thereby to reduce the gain of the amplifier via said gain control circuit.

17. An IC amplifier as claimed in claim 16 wherein the storage capacitor includes a charge path and a discharge path arranged so that the discharge time of the storage capacitor is much faster than its charge time.

18. An IC amplifier as claimed in claim 8 wherein the control transistor is responsive to said amplifier input signal but its collector current is independent of the output transistor output signal.

19. An IC amplifier as claimed in claim 8 wherein said control transistor and said output transistor comprise bipolar transistors in which said control electrodes are base electrodes, said control transistor being coupled to said output transistor so that a base current of the control transistor flows as a base current through the base of the output transistor such that said collector current of the control transistor is an amplified representation of the base current of the output transistor.

20. An IC amplifier comprising:

an amplifier output stare including at least one output transistor subject to saturation by its output current at a given level of an amplifier input signal, a control transistor having an output electrode coupled to a control electrode of the at least one output transistor and a control electrode for receiving the amplifier input signal whereby the control transistor supplies at least a part of an input current to the control electrode of the at least one output transistor, a threshold circuit coupled to a main electrode of the control transistor so that the threshold circuit will switch state when a current passing through the control transistor exceeds a given threshold level indicative of the start of saturation of said at least one output transistor, and wherein the control transistor has a base/emitter circuit and a collector/emitter circuit and the output transistor has a base/emitter circuit, said IC amplifier further comprising a current source DC coupled via a first current path to both the base/emitter circuit and the collector/emitter circuit of the control transistor and Via a second current path to the base/ emitter circuit of the output transistor.

* * * * *